United States Patent
Mahulikar et al.

[19]

[11] Patent Number: 5,939,214
[45] Date of Patent: Aug. 17, 1999

[54] THERMAL PERFORMANCE PACKAGE FOR INTEGRATED CIRCUIT CHIP

[75] Inventors: Deepak Mahulikar, Meriden; Jacob Crane, Woodbridge, both of Conn.; Abid Ali Khan, Godfrey, Ill.

[73] Assignee: Advanced Technology Interconnect, Incorporated, Manteca, Calif.

[21] Appl. No.: 07/984,147

[22] Filed: Nov. 24, 1992

Related U.S. Application Data

[63] Continuation of application No. 07/809,081, Dec. 9, 1991, abandoned, which is a continuation of application No. 07/663,340, Feb. 27, 1991, abandoned, which is a division of application No. 07/359,305, May 31, 1989, Pat. No. 5,015,803.

[51] Int. Cl.$^6$ ............................ H01L 23/28; H01L 23/36
[52] U.S. Cl. .................... 428/626; 428/652; 257/712; 174/52.4
[58] Field of Search ..................... 428/620, 674, 428/675, 676, 677, 931, 626, 652; 257/666, 675, 677, 712, 720; 174/52.4, 52.5, 52.6

[56] References Cited

U.S. PATENT DOCUMENTS

| | | | |
|---|---|---|---|
| 3,248,681 | 4/1966 | Reintgen | 428/614 |
| 3,351,700 | 11/1967 | Savolainen et al. | 428/620 |
| 3,368,122 | 2/1968 | Fishman et al. | 428/620 |
| 3,399,332 | 8/1968 | Savolainen | 428/620 |
| 3,930,114 | 12/1975 | Hodge | 257/675 |
| 4,025,997 | 5/1977 | Gernitis | 428/663 |
| 4,141,029 | 2/1979 | Dromsky | 428/596 |
| 4,283,464 | 8/1981 | Hascoe | 428/614 |
| 4,298,883 | 11/1981 | Komatsu et al. | 257/675 |
| 4,401,728 | 8/1983 | Larker | 428/614 |
| 4,635,092 | 1/1987 | Yerman et al. | 357/81 |
| 4,811,166 | 3/1989 | Alvarez et al. | 361/386 |
| 4,907,125 | 3/1990 | Drekmeier et al. | 357/81 |
| 4,996,115 | 2/1991 | Eerkes et al. | 428/931 |
| 5,001,546 | 3/1991 | Butt | 357/71 |
| 5,044,074 | 9/1991 | Hadwiger et al. | 29/848 |
| 5,073,840 | 12/1991 | Coors | 361/388 |

FOREIGN PATENT DOCUMENTS

| | | | |
|---|---|---|---|
| 53-92664 | 8/1978 | Japan | 357/81 |
| 60-164346 | 8/1985 | Japan | 357/70 |
| 60-165744 | 8/1985 | Japan | 357/81 |
| 61-39555 | 2/1986 | Japan | 357/81 |
| 61-240666 | 10/1986 | Japan | 357/81 |
| 63-102326 | 5/1988 | Japan | 428/675 |
| 63-252457 | 10/1988 | Japan | 357/82 |
| 63-296361 | 12/1988 | Japan | 357/81 |

OTHER PUBLICATIONS

Jerry Lyman, "Military Moves Headlong into Surface Mounting", Electronics, Jul. 10, 1986, 2 pages.
M. A. Hunter, "Low Expansion Alloys", Metals Handbook, 8$^{th}$ Ed., vol. 1, pp. 816–819. (no date).
Abstract for JP 59–225552, Yamanaka (no date).
Abstract for JP 0132849, Feb. 13, 1985, Olin.
Abstract for JP 60–242653, Watanabe (no date).
Modern Plastics Encyclopedia '92 (mid Oct. 1991 issue) at pp. 384–385.

*Primary Examiner*—John J. Zimmerman
*Attorney, Agent, or Firm*—Gregory S. Rosenblatt; Wiggin & Dana

[57] ABSTRACT

Composite materials for electronic packages are disclosed. The composite materials comprise a core layer and first and second cladding layers. The core and cladding layer compositions and thicknesses are selected to maximize thermal and electrical conductivity and to minimize the coefficient of thermal expansion of the composite. The composite material may be employed to fashion the package base, the leadframe, a heat spreader or combinations thereof. In one embodiment, a portion of the first cladding layer is removed so that an electronic device may be mounted directly to a high thermal conductivity core.

10 Claims, 4 Drawing Sheets

THERMAL PERFORMANCE PACKAGE FOR INTEGRATED CIRCUIT CHIP

CROSS REFERENCE TO RELATED APPLICATION

This application is a continuation of U.S. patent application Ser. No. 07/809,081 filed Dec. 9, 1991, now abandoned, which is a continuation of U.S. patent application Ser. No. 07/663,340 filed Feb. 27, 1991, now abandoned, which is a divisional of U.S. patent application Ser. No. 07/359,305 filed May 31, 1989, now U.S. Pat. No. 5,015,803.

BACKGROUND OF THE INVENTION

The present invention generally relates to packages adapted to house a microelectronic circuit device such as a silicon based semiconductor die. More particularly, the invention relates to a metal package having components with improved thermal and electrical performance.

Hermetically sealed packages for integrated circuit chips are typically comprised of a base component and a lid component which when bonded together define a cavity therebetween. The microelectronic circuit device is housed within the cavity. A leadframe is typically disposed between the base and lid and electrically interconnects the microelectronic device to external circuitry such as a printed circuit board. The integrated circuit is electrically connected to the leadframe by relatively small diameter gold or aluminum wires. Alternatively, connection between the chip and leadframe may be effected by tape automated bonding (TAB) techniques. In TAB, thin strips of copper or a copper alloy foil provide the necessary electrical interconnection. The leadframe further has a plurality of legs protruding outwardly from its central portion. The legs extend beyond the perimeter of the base and lid to provide terminals leading from the package.

Normal operation of the integrated circuit in the chip generates heat within the package. As the temperature of the typically silicon based microelectronic device increases, the internal resistance of the device also increases leading to degradation of the electrical performance of the device. Diffusion of metallic species such as from the circuitry metallization is increased further shortening the usable life of the device. As a general rule, every 10° C. increase in device temperature shortens the usable life of the device by 50%.

In addition to shortening the usable life of the microelectronic device, as the temperature of the device and package components increases, so do thermally induced mechanical stresses. If the package base has a relatively high coefficient of thermal expansion, for example when copper or copper based package components are employed, the stresses on the device are severe enough to lead to fracture of the silicon based die. Thus, dual objectives of integrated circuit package design are to incorporate features in the package which minimize thermal expansion and remove heat.

To minimize thermally induced stresses, the components should be fabricated from materials having thermal expansion coefficients approximately matching that of the microelectronic device. To reduce the accumulation of heat within the package, those package components which dissipate heat, such as the base in a hermetically sealed package and the leadframe and optionally a heat sink or heat spreader in a non-hermetic plastic package, should be made from materials having high thermal conductivity. Further, some of these same components, such as the leadframe form a part of the conductive path of the package and must have suitable electrical conductivity.

One prior art integrated circuit chip package, commonly known as the CERDIP for ceramic dual-in-line package, is basically a ceramic package. The lid and base components are both alumina. The coefficient of thermal expansion of $Al_2O_3$ is quite low and stresses to the electronic device are minimized. However, the ceramic base has high thermal resistance. The CERDIP is inadequate as a medium for carrying away and dissipating the heat generated by large scale integrated circuits or power devices.

In another prior art integrated circuit chip package, the base is constructed of metal, preferably copper or a copper based alloy. Metals are highly effective for thermal dissipation but have relatively high coefficients of thermal expansion. A severe mismatch with the silicon chip is often experienced. An additional insert material such as a buffer must be interposed between the chip and the base component. The buffer adds cost to the package and reduces thermal conduction from the chip to the package base.

Yet another package known in the art is the molded plastic package. A microelectronic device is attached to a metal bond pad and electrically interconnected to a leadframe. This assembly is then encapsulated within a molded plastic resin such as an epoxy. The thermal dissipation capability of the plastic resin is quite poor so thermal dissipation occurs by way of the leadframe or a heat sink or heat spreader molded into the package. If the leadframe and heat sink are fashioned from a low expansion metal such as alloy 42, inadequate heat dissipation is achieved. The use of a high expansion metal such as copper results in suitable heat dissipation, but stresses resulting from the high coefficient of thermal expansion of the copper often lead to fracture of the package or the device.

From the drawbacks of the constructions of the above packages, one can readily appreciate that the dual objectives of minimizing or matching thermal expansion and removing heat have been difficult to attain in practice. Consequently, a need still remains for a way to achieve these objectives.

SUMMARY OF THE INVENTION

The present invention provides an improved thermal performance integrated circuit chip package designed to satisfy the aforementioned needs. Dramatic improvement of the thermal performance is brought about by utilizing a clad metal base. The composite base comprises a first metal core layer clad on opposing sides with first and second metal cladding layers. In one embodiment, the core is characterized by high thermal conductivity and high thermal expansion. The first and second cladding layers have a coefficient of thermal expansion less than that of the microelectronic device.

No changes are required in the manufacturing process of the electronic package to incorporate the composite base. Standard package assembly techniques may be employed. A lid component is positioned in spaced relationship to the composite base. A leadframe is disposed between the composite base component and the lid component. A bonding material seals the leadframe to both the composite base and to the lid. The composite base and the lid define a cavity for housing the electronic device which is bonded by a die attach to the base component and electrically interconnected to the leadframe.

The composite base has a thermal expansion coefficient close to that of the semiconductor device. The thermal performance of the package is significantly better than that of the CERDIP. The integrated circuit chip can now operate at a much lower temperature because of better dissipation of heat. Additionally, the device is not subject to thermally induced mechanical stresses resulting from a coefficient of thermal expansion mismatch between the package base and the device.

In accordance with a second embodiment of the invention, a composite leadframe is provided. The composite leadframe is also composed of a metal core layer clad on opposing sides by metal cladding layers. The properties of the metal core layer and the cladding layers are essentially similar to the requirements of the first core layer and first and second cladding layers of the base component as described above.

The composite leadframe provides superior thermal dissipation without the coefficient of thermal expansion mismatch identified with prior art copper alloy leadframes. The leadframe of the invention may be incorporated within a plastic package housing or within a standard metal or ceramic package housing. Further, the composite leadframe may be incorporated with the composite base of the invention.

A composite heat sink or heat spreader is also within the scope of the invention. The composite heat sink has a metal core layer and metal cladding layers essentially as described above. The composite heat sink is of particular value to increase the thermal dissipation of molded plastic packages.

These and other features and advantages of the present invention will become apparent to those skilled in the art upon a reading of the following detailed description when taken in conjunction with the drawings wherein there is shown and described an illustrative embodiment of the invention.

In the course of the following detailed description, reference will be made to the attached drawings in which:

DESCRIPTION OF THE PREFERRED EMBODIMENT

Figure 1:
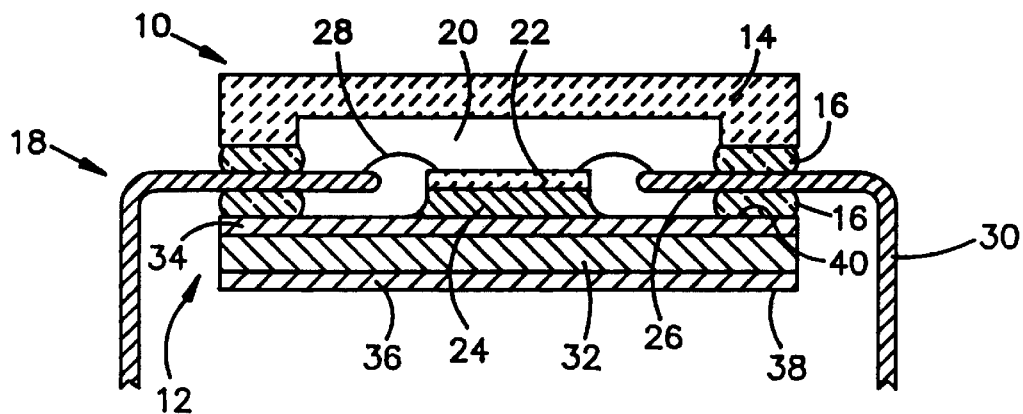
FIG. 1 is a cross-sectional representation of a hermetic sealed integrated circuit chip package in accordance with the present invention.

Referring now to the drawings, and particularly to FIG. 1, there is illustrated a low profile, integrated circuit chip package, generally designated 10. The package 10 is preferably glass sealed and hermetic. However, the package 10 may also be sealed with a polymer adhesive, such as an epoxy to form a non-hermetic metal package. Both hermetic and non-hermetic electronic packages are included within the invention.

In its basic components, the package 10 of FIG. 1 includes a base 12, a lid 14, a sealing means 16 and a leadframe 18. The lid 14 is spaced from the base 12 and defines a cavity 20 therebetween. A microelectronic circuit chip 22 is disposed in the cavity 20 and overlies a central portion of the base 12. The chip 22 is secured to the base 12 by a die attach material 24. The sealing means 16 which is preferably a sealing glass is positioned between the base 12 and the lid 14. As seen in FIG. 1, the base 12, lid 14 and glass layer 16 have an overall flat, layered construction.

The leadframe 18 is located between the base 12 and lid 14 and embedded within the sealing glass 16. The leadframe 18 has generally planar inner leads 26 mounted within the layer of glass 16. The leads 26 surround the integrated circuit chip 22 in a quad-pack type configuration. The leads 26 may approach the chip 22 from any desired number of sides, for example in a DIP, or dual-in-line package configuration, the leads would approach the chip from two opposing sides. The integrated circuit within the chip 22 is electrically connected to the leads 26 by bonding conductor wires 28 or, alternatively, by TAB type metal foil interconnects. The leadframe 18 further has a plurality of legs 30 extending beyond the perimeter of the base 12, lid 14 and glass layer 16. The leadframe legs 30 are bent to a desired radius and provide terminals to connect the package 10 to an external circuit.

In accordance with the principles of the present invention, the base 12 of the package 10 is a composite material composed of a first metal or metal alloy core layer 32 and first and second metal or metal alloy cladding layers 34, 36. The criteria for selecting the composition of the core layer and the cladding layers is that one of the metals has high thermal conductivity and a high thermal coefficient of expansion (TCE) and the other metal has a low thermal coefficient of expansion.

One of the metals must have relatively high thermal conductivity, $T_c$. Relatively high thermal conductivity means significantly higher than the thermal conductivity of alloy 42. Alloy 42 is an iron-nickel alloy (nominal composition by weight 41% nickel and 59% iron) which is commonly used for leadframe applications. Alloy 42 has a $T_c$ of about 12 watts per meter degree Kelvin (W/m.K). Preferred high thermal conductivity metals include copper ($T_c$=398 W/m.K), aluminum ($T_c$=274 W/m.K) and alloys thereof such as copper alloy C194 (nominal composition by weight 97.5% copper, 2.35% iron, 0.03% phosphorous and 0.12% zinc, $T_c$=260 W/m.K) and aluminum alloy 3003 (nominal composition by weight 98.6% aluminum, 0.12% copper and 1.2% manganese, $T_c$=180 W/m.K). The specific compositions of high thermal conductivity metals given above are illustrative only and do not represent the only acceptable materials. Any suitable high conductivity material having a $T_c$ in excess of about 150 W/m.K is within the scope of the invention.

The second metal is selected to have a low thermal coefficient of expansion. An exemplary listing of such metals includes alloy 42 (TCE=42×10$^{-7}$ in/in/°C.), Invar (a trademark for an alloy comprising 35% by weight nickel and 65% by weight iron, TCE=35×10$^{-7}$ in/in/°C.) and molybdenum (TCE=45×10$^{-7}$ in/in/°C.). Other metals having a coefficient of thermal expansion less than that of the microelectronic device (about 60×10$^{-7}$ in/in/°C. for a silicon based semiconductor device or about 52×10⁻⁷ in/in/°C. for an Al₂O₃ hybrid circuit device are acceptable.

Further, the two metals must have the necessary tensile strength and chemical compatibility to permit cladding or another form of metallurgical bonding. The ratio of metal thicknesses must be tightly controlled to achieve a desired thermal expansion coefficient, preferably within about 10% of that of the microelectronic device, as well as the desired thermal conductivity. The low TCE metal should have an elastic modulus (E) significantly higher than the elastic modulus of the high TCE metal. The TCE of the composite is therefore influenced to a greater extent by the low TCE metal. For example, in a preferred copper/molybdenum composite, $E_{Cu}$=140 GPa and $E_{Mo}$=300 GPa.

In the composite base package 10 illustrated in FIG. 1, the base 12 comprises in a first embodiment, a high expansion core 32 and first and second low coefficient of thermal expansion cladding layers 34 and 36. A preferred high expansion core material is copper or a copper based alloy. Alloy 42 is an exemplary cladding material as are those low expansion metals and alloys which are capable of forming a surface refractory oxide layer as will be described hereinbelow. The thermal coefficient of expansion of the composite is in the range of 40 to 80×10⁻⁷ in/in/°C. However, there is enough copper in the base 12 to carry heat from the package 10.

The ratio of thicknesses of the core layer to the cladding layers is dependent upon the desired properties of the composite base. Increasing the high expansion layer thickness increases the ability of the package substrate to remove heat from the electrical device. However, increasing the high expansion layer thickness also increases the coefficient of thermal expansion of the base increasing the thermally induced mechanical stresses applied to the chip.

Increasing the thickness of the low expansion metal layer reduces the coefficient of thermal expansion of the clad material, however, thermal dissipation is also reduced. The inventors have determined that the thermal requirements of an effective composite base material include an average thermal resistance $\Theta_{JC}$ less than about 1.0° C./watt and a coefficient of thermal expansion of less than about 70×10⁻⁷ in/in/°C.

$\Theta_{JC}$ is a measurement of the difference in temperature between the junction (J) and the case (C). For a given wattage chip 22, the temperature is measured at the junction of the chip 22 and die attach 24 and at a position along an exterior surface 38 of the base 12. The difference in temperature is a function of the chip size, the thickness of the heat conducting layer and the effective thermal conductivity of the heat conducting layer. By maintaining a constant chip size and base thickness, the relative thermal resistance of the base may be determined.

Figure 2:
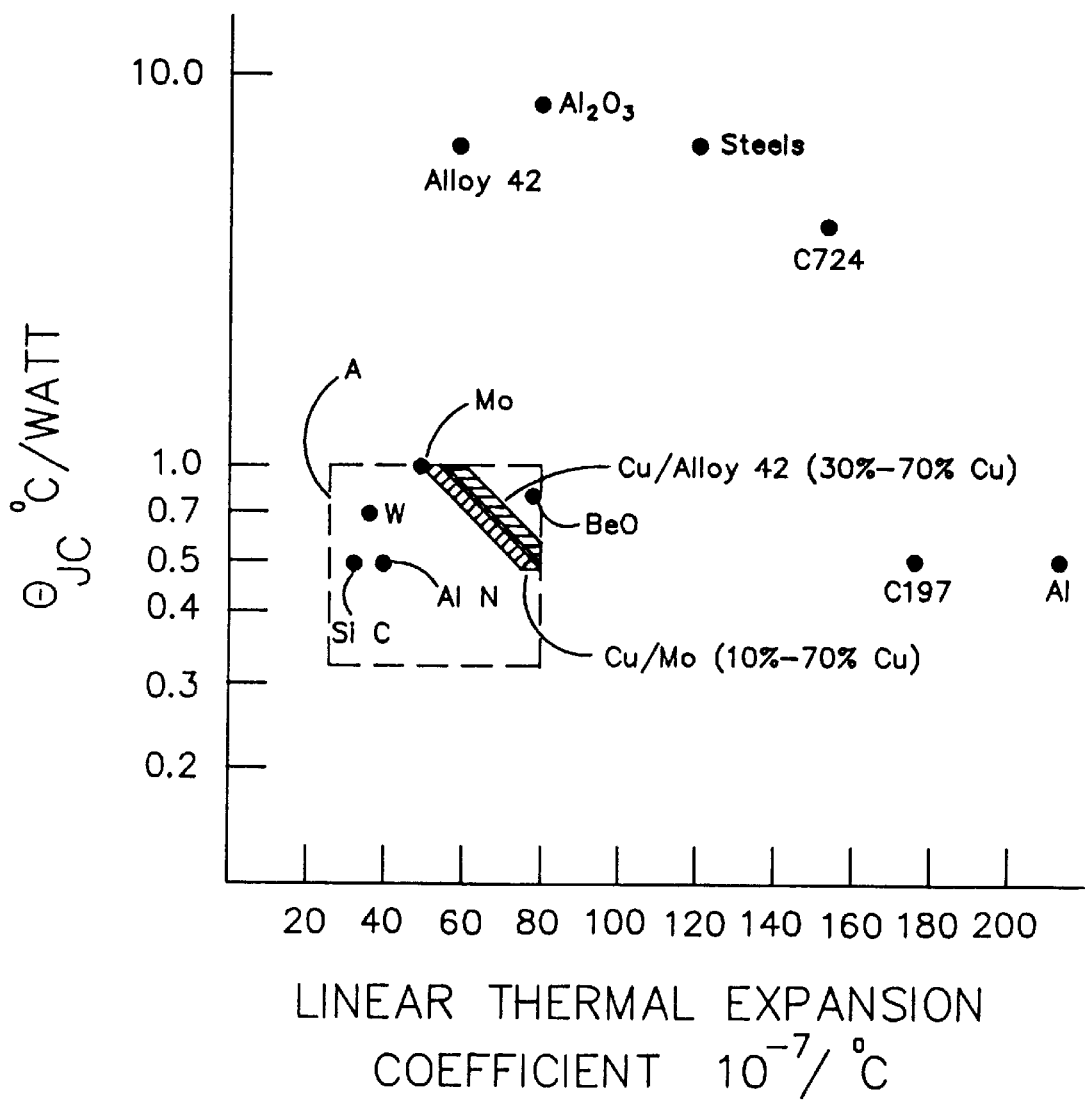
FIG. 2 is a graphic representation of thermal dissipation capacity of selected materials compared to the linear thermal expansion coefficient of those materials and identifying a preferred range of the invention.

There is a region designated A in FIG. 2 which satisfies these requirements. As illustrated, certain refractory ceramics such as aluminum nitride and silicon carbide and metals such as tungsten and molybdenum satisfy the requirements of good thermal dissipation and low coefficient of thermal expansion. However, these materials have disadvantages relating to cost, machinability, environmental stability and density which reduce their utility. Composites of copper and Alloy 42 having from about 30% to about 70% copper fall within the desired region A. More preferably, the copper thickness is from about 40% to about 60% the overall sample. Most preferably from the standpoint of thermal dissipation and acceptable coefficient of thermal expansion, is a copper thickness of from about 40% to about 50%.

Another composite which has satisfactory thermal characteristics is copper and molybdenum. As shown in FIG. 2, from about 10% to about 70% of copper by thickness will result in a composite base having suitable thermal properties. More preferably, the copper thickness is from about 50% by thickness to about 70% by thickness.

For comparison, several other materials commonly used in the construction of electronic packages are also indicated on FIG. 2. Note that the copper alloys C197 (nominal composition by weight 99.0% copper, 0.6% iron, 0.2% phosphorous and 0.12% zinc) and C724 (nominal composition by weight 84.3% copper, 13.0% nickel, 2.0% aluminum, 0.5% manganese and 0.2% magnesium) as well as aluminum have excessively high coefficients of thermal expansion while alloy 42, alumina, and steel all have inadequate thermal dissipation capabilities as measured by $\Theta_{JC}$.

Referring back to FIG. 1, the core layer 32 of the composite base 12 may comprise either the high expansion component or the low expansion component and the first and second clad layers 34 and 36 the other component. As long as the ratio of thicknesses are correct, the composite base will exhibit the desired coefficient of thermal expansion. It is preferred, however, to maintain the thickness of first and second clad layers 34, 36 approximately equal to each other to minimize flexure of the composite base 12 due to the mismatch with the expansion coefficient of the core 32.

If the seal means 16 is a solder glass, the first cladding layer 34 preferably includes a glass sealable surface 40. The glass sealable surface need not coat the entire surface 40 of the first cladding layer 34, only that portion of the surface which contacts the sealing glass 16. The glass sealable surface 40 may be obtained by forming the first cladding layer 34 from a refractory oxide forming alloy such as copper alloy C638 (nominal composition by weight 95.0% copper, 2.8% by weight aluminum, 1.8% Si and 0.4% cobalt) or by coating the surface with an oxide forming material such as electrodeposited nickel.

Once a glass sealable surface has been formed, the sealing glass is applied by any desired technique such as screen printing and sealed by an appropriate thermal profile.

The sealing means 16 may also comprise a polymer adhesive such as an epoxy. A barrier layer may preferably be added to the surface 40 of the first cladding layer 34. The barrier layer inhibits metal catalyzed degradation of the adhesive. As with the glass sealable layer described hereinabove, the barrier layer preferably covers at least that portion of the first cladding layer 34 which contacts the sealing means 16. Suitable barrier layers include a refractory oxide and a nickel coating.

The lid component 14 may be any desired material having a coefficient of thermal expansion approximately matching that of the base component, for example, a low expansion metal alloy, a composite or Al₂O₃.

Figure 3:
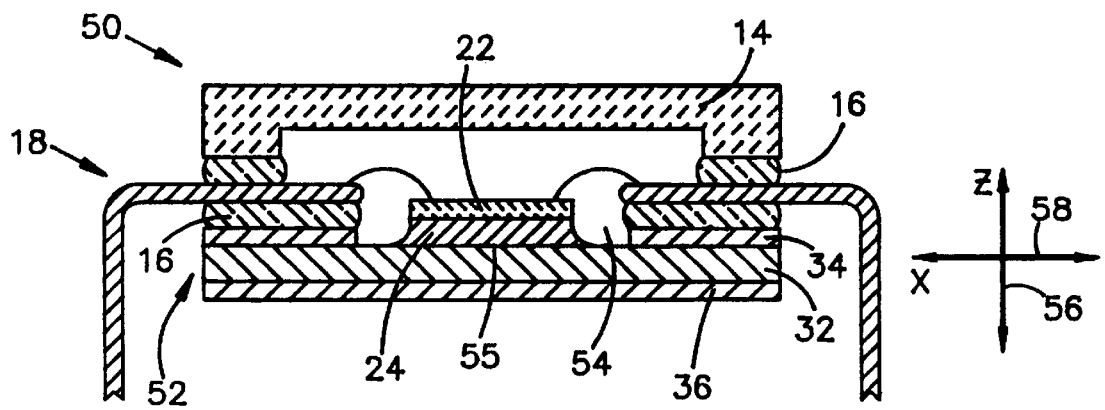
FIG. 3 is a cross-sectional representation of a composite base particularly suited for glass sealed packages in accordance with the invention.

Referring now to FIG. 3, another embodiment of the invention is disclosed. The package 50 includes a composite base 52 which maximizes thermal dissipation and permits improved glass to metal sealing. While the package 10 illustrated in FIG. 1 may comprise either a high conductivity core and a low coefficient of thermal expansion clad or a low coefficient of thermal expansion core and a high conductivity clad, the package illustrated in FIG. 3 is limited to composites with a high conductivity core.

A cavity 54 is formed through a portion 55 of the low expansion material first cladding layer 34 by any desired means such as mechanical or chemical milling. The portion 55 is selected to be that region of the composite base 52 which is to receive the microelectronic device 22. The device 22 is bonded directly to the high thermal conductivity first core layer 32 by a die attach 24. The die attach 24 is preferably a metal based solder such as a lead/tin alloy. Also, a barrier layer may be applied to the exposed section of the core layer 32 to improve the die attach. Such a barrier layer is preferrably a metallic coating such as nickel. Two advantages are achieved by using the embodiment illustrated in FIG. 3.

Thermal dissipation is enhanced. The chip 22 is bonded directly to a good thermal dissipater. The heat generated by the device does not pass through a thermally insulating low expansion layer. While thermal dissipation in the "Z" direction, as indicated by arrow 56 in FIG. 3, requires conduction through the second low expansion clad layer 36, thermal conduction along the "X", as indicated by arrow 58 in FIG. 3, and "Y", not shown, but perpendicular to "X" and "Z", directions readily conducts heat away from the device.

A second advantage is achieved by glass sealing directly to the low expansion material. There are many sealing glasses known in the art which are suitable for bonding to low expansion materials. One suitable example is known as KC 401M which is manufactured by Kyocera. KC 401M is comprised of a lead-zinc-borate with a low TCE filler added. The glass has a coefficient of thermal expansion of about 65 to $75 \times 10^{-7}$ in/in/°C.

A preferred material for the first and second cladding layers 34, 36 is Alloy 42. Glass sealing to Alloy 42 is difficult due to the inability to form an adherent oxide layer on the surface of the alloy. A second material which readily forms an adherent oxide may be deposited on the base component. As disclosed in U.S. Pat. No. 4,796,083, such a suitable deposition may be a nickel coating applied by electrolytic deposition.

Alternatively, rather than Alloy 42, the low coefficient of thermal expansion cladding layers 34, 36 may be formed from a material which forms an adherent oxide layer in situ. As applied to this application, the term "in situ" refers to the capability of forming an oxide layer in an oxidizing atmosphere with the addition of heat and possibly water vapor but without the deposition of a second metal or metal alloy layer. An exemplary low expansion alloy capable of in situ oxide formation is a glass sealable iron-nickel alloy comprising by weight from about 30% to about 60% nickel, from about 0.001% to about 0.15% nitrogen, at least one element selected from the group consisting of from about 1% to about 10% molybdenum and from about 0.001% to about 2% aluminum and the balance iron. The alloy is disclosed in U.S. Pat. No. 4,816,216.

As disclosed in the embodiment illustrated by FIG. 1, the composite is not limited to copper and alloy 42. Other combinations such as copper and molybdenum or aluminum and alloy 42 are also within the scope of the invention.

The lid component 14, does not contribute significantly to the thermal dissipation of the package 50, but does contribute rigidity to protect the electronic device 22 from damage due to package flexure, for example, during acceleration. The lid may be comprised of any material having a coefficient of thermal expansion approximately equal to that of the composite base. The lid should also be glass bondable or coated with a material which readily forms a glass bondable refractory oxide as discussed hereinabove. A preferred lid composition is aluminum oxide ($Al_2O_3$) due to the relatively low density and high rigidity of the material.

As with the embodiment of the package illustrated in FIG. 1, the seal need not be glass, a polymer seal resulting in a non-hermetic metal package is within the scope of the invention. Further, glass sealable layers or barrier layers as disclosed hereinabove may be employed.

Figure 4:
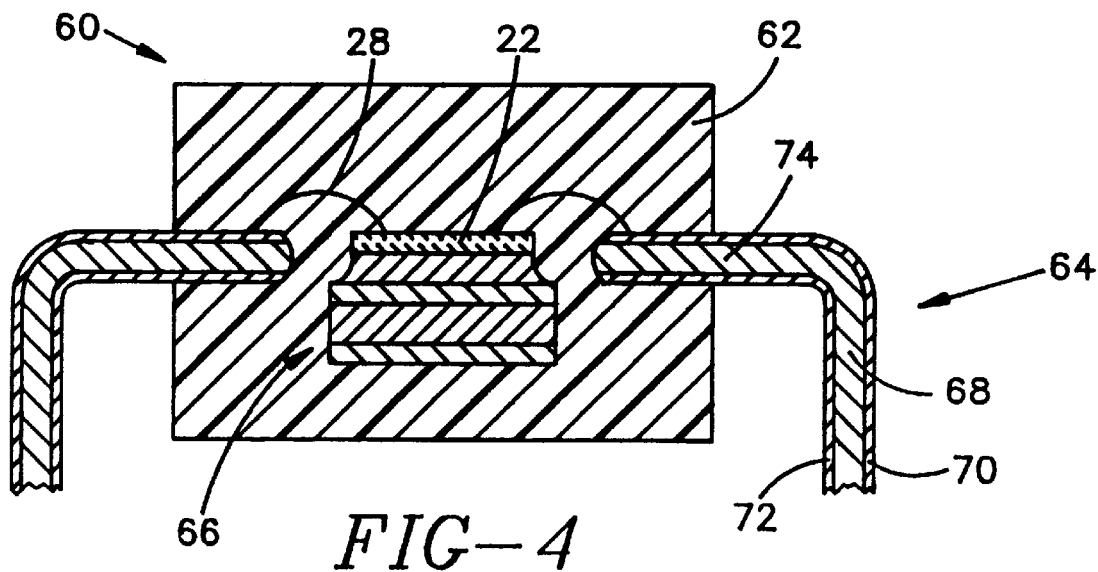
FIG. 4 is a cross-sectional representation of a molded plastic electronic package including a composite leadframe in accordance with an embodiment of the invention.

Referring now to FIG. 4, there is illustrated another low profile, integrated circuit chip package, generally designated 60. The package 60 is not a hermetic package. In its basic components, the package 60 includes a plastic housing 62 for housing an integrated circuit chip 22 and a leadframe 64 partially embedded within the housing 62. The chip 22 is bonded to a bond pad 66 by die attach 24. The base and cover components of the package may be molded about the leadframe as a monolithic unit as illustrated in FIG. 4. Alternatively, discrete plastic base and cover components (not shown) may be bonded together, for example, with an epoxy adhesive. The leadframe 64 provides the medium for dissipation of heat as well as forming part of the electrical conduction path.

In accordance with the present invention, the leadframe 64 is composed of a composite material meeting the same criteria as the composite material composing the base 12 in the hermetically-sealed package 10 as illustrated in FIG. 1. Thus, the description of the composite material for the base 12 applies equally to the composite material for the leadframe 64, that is, the leadframe 64 has a core layer 68 of a first metal and cladding layers 70, 72 of a second metal.

It is to be noted that the leadframe 64 is not drawn to scale to facilitate illustrating the composite nature of the leadframe, the leadframe 64 has the same overall thickness as the leadframe 18 employed for the metal packages. Typically the leadframe thickness is from about 0.005 inches to about 0.020 inches. Most commonly, the leadframe thickness is about 0.010 inches +/−0.001 inches.

In contrast to copper alloy leadframes typically used in molded plastic packages which have significant mismatch with the silicon chip, the composite leadframe 68 has a much lower TCE and substantially matches the coefficient of thermal expansion of the silicon chip. Also, the composite material of the leadframe 68 meets or exceeds the other performance requirements for leadframe materials for plastic packages in generally, namely, tensile strength, solderability, bend formability, and lead bend fatigue resistance.

The composite leadframe may be fashioned with the high thermal conductivity material or the low expansion material as the second core layer 68. In a plastic package, heat dissipation is primarily along the bond wires 28 and through the leads 74. For maximum thermal conductivity within a plastic package, it is preferable to position the high thermal conductivity material as the cladding layers 70, 72.

While the composite leadframe is preferably comprised of an Alloy 42 core 68 and copper cladding layers 70, 72, it should be realized that any high thermal conductivity material which may be readily clad is acceptable. Preferred high conductivity materials include copper, aluminum and alloys thereof. Likewise, the low thermal expansion core may be any suitable material such as Alloy 42, Invar or molybdenum.

Figure 5:
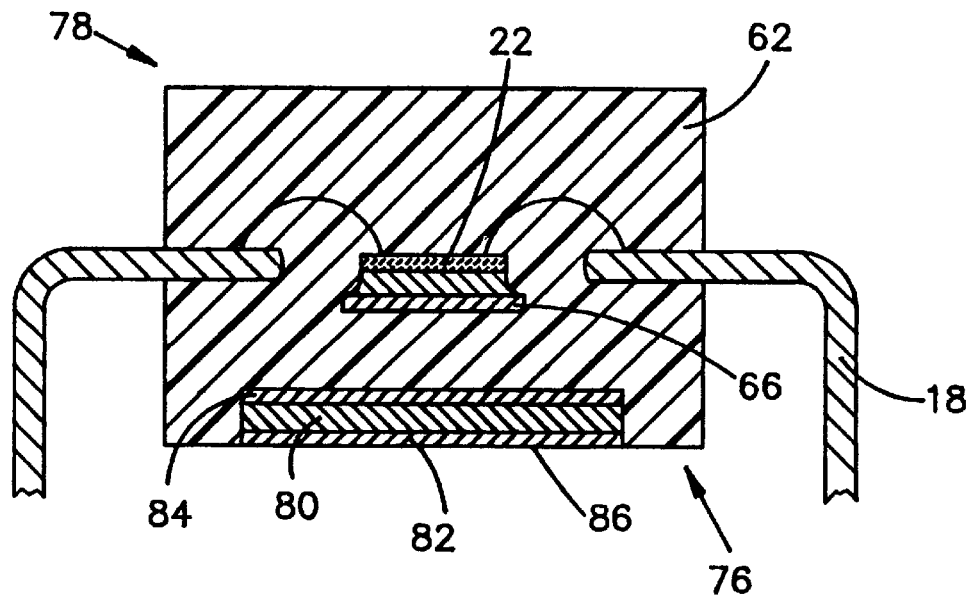
FIG. 5 is a cross-sectional representation of a molded plastic electronic package including a composite heat spreader in accordance with an embodiment of the invention.

In yet another embodiment of the invention shown in FIG. 5, a heat spreader 76 is molded into the plastic housing 62 of the package 78. The heat spreader is comprised of a metal core layer 80 and cladding layers 82, 84. The core and cladding layers are selected so that the composite heat spreader 76 has high thermal conductivity and a TCE about equal to the TCE of the microelectronic device 22 as detailed above. While the leadframe 18 is illustrated as a monolithic structure, the composite leadframe 64 illustrated in FIG. 4 may be employed to enhance thermal dissipation.

While FIG. 5 illustrates a heat spreader 76 positioned so that a surface 86 is exposed to the atmosphere, it is within the scope of the invention to completely encapsulate the heat spreader 76 within the plastic housing 62. Also, rather than mounting the electronic device 22 on a bonding pad 66 as shown, the bonding pad may be omitted and the electronic device 22 bonded directly to the heat spreader 76.

Figure 6:
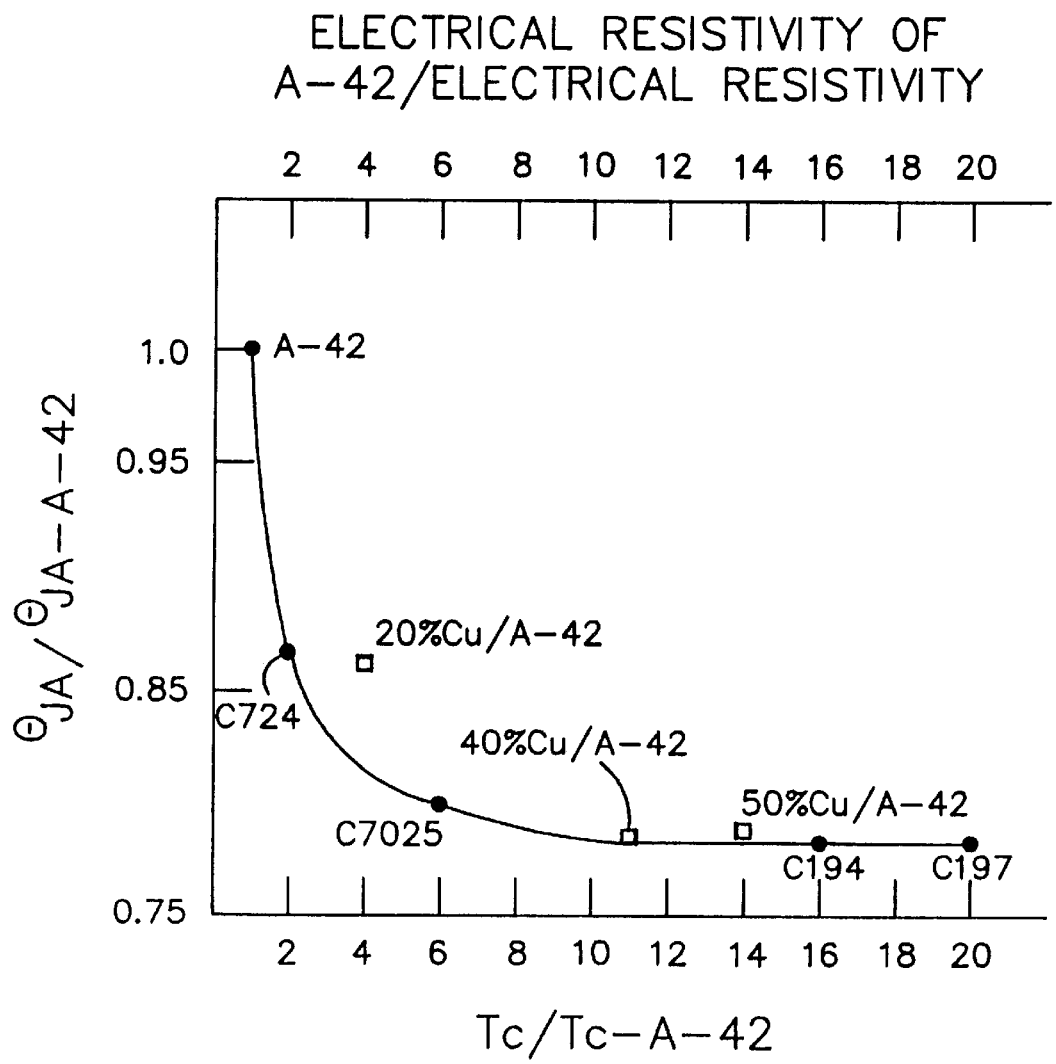
FIG. 6 is a graphical representation of thermal dissipation capacity as compared to both thermal conductivity and electrical resistivity for conventional leadframe alloys and for the composite leadframes formed in accordance with the invention.

As illustrated in FIG. 6, using a simulated P-DIP (plastic dual-in-line package), a composite leadframe comprising copper cladding layers and an Alloy 42 core layer had electrical and thermal characteristics approaching that of high conductivity copper alloys. In FIG. 6, the thermal dissipation, electrical resistivity and thermal conduction were all compared to Alloy 42 and the ratio of the experimental value to the Alloy 42 value recorded.

For thermal dissipation, $\Theta_{JA}$ values were obtained. $\Theta_{JA}$ is the temperature differential between the chip/die attach junction and the ambient atmosphere. Unlike metal packages where the entire casing is approximately the same temperature and $\Theta_{JC}$ values may be employed, plastic packages are poor thermal conductors and the case temperature is too dependent on location. $\Theta_{JA}$ is the preferred calculation for plastic packages. The lower the temperature differential, the better the thermal conductivity of the package. Since only the leadframe composition varied from package to package, the lower the $\Theta_{JA}$ as compared to $\Theta_{JA}$ for alloy 42, the better the thermal conductivity of the leadframe.

Electrical resistivity was measured by placing a sample of the leadframe in a Kelvin bridge and measuring the electrical resistivity. The lower the resistivity, the better the leadframe conducts electricity and the more desirable the composite as a leadframe material.

Thermal conductivity $T_c$ was estimated based on the electrical resistivity measurements.

Copper thicknesses of from about 30% (a three layer clad comprising 15% Cu/80% A-42/15% Cu) to about 70% (35% Cu/80% A-42/35% Cu) were found to provide superior leadframe materials. In the preferred range of from about 40% to about 50% copper by thickness, the electrical and thermal performance of the composite leadframe was measured to be superior to that of high strength copper alloys such as C724 and C7025 (nominal composition by weight 96.0% Cu, 3% Ni, 0.75% Si and 0.25% Mg). The properties of the preferred composite leadframe approached that of the high conductivity copper alloys such as C194 and C197.

While the composite leadframe 64 has been described in terms of a plastic package 60 as illustrated in FIG. 4, the composite leadframe is equally suitable for the composite base metal packages as disclosed in FIGS. 1 and 3, standard metal packages as well as ceramic based packages.

Yet another advantage of the invention is illustrated in FIG. 4. The bond pad 66 is a feature of conventional plastic packages. The bond pad is typically formed from the same material as the leadframe and provides an electrically conductive base for the device 22 as well as a means to transport the device along with the leadframe 64. The bond pad has the same composition as the leadframe, so the use of a low expansion composite leadframe 64 provides a bond pad 66 with a low TCE. Therefore, the device 22 is not stressed due to thermal mismatch as occurs with prior art copper bond pads.

It is thought that the present invention and many of its attendant advantages will be understood from the foregoing description and it will be apparent that various changes may be made in the form, construction and arrangement of the parts thereof without departing from the spirit and scope of the invention or sacrificing all of its material advantages. The form hereinbefore described being merely a preferred or exemplary embodiment thereof.

We claim:

1. A package for housing a microelectronic circuit, comprising:
    a plastic housing;
    a leadframe partially encapsulated within said plastic housing;
    a microelectronic device electrically interconnected to said leadframe; and
    a composite heat spreader at least partially embedded in said plastic housing, said composite heat spreader comprising a core layer and first and second cladding layers bonded to opposing sides of said core layer.

2. The package of claim 1 wherein the thickness of said first cladding layer is substantially equal to the thickness of said second cladding layer.

3. The package of claim 2 wherein said microelectronic device is bonded directly to said composite heat spreader.

4. The package of claim 3 wherein one surface of said composite heat spreader is exposed to the atmosphere.

5. The package of claim 3 wherein said composite heat spreader is completely encapsulated within said plastic housing.

6. The package of claim 2 wherein said microelectronic device is bonded to a bonding pad.

7. The package of claim 6 wherein one surface of said composite heat spreader is exposed to the atmosphere.

8. The package of claim 6 wherein said composite heat spreader is completely encapsulated within said plastic housing.

9. The package of claim 2 wherein said leadframe is a composite comprising a core layer in first and second cladding layers bonded to opposing sides of said core layer.

10. The package of claim 9 wherein said leadframe core layer is copper or a copper alloy and said leadframe first and second cladding layers are aluminum or an aluminum alloy.

* * * * *